United States Patent
Hayashi et al.

(10) Patent No.: US 6,440,824 B1
(45) Date of Patent: Aug. 27, 2002

(54) METHOD OF CRYSTALLIZING A SEMICONDUCTOR THIN FILM, AND METHOD OF MANUFACTURING A THIN-FILM SEMICONDUCTOR DEVICE

(75) Inventors: Hisao Hayashi; Hiroyuki Ikeda; Makoto Takatoku, all of Kanagawa (JP)

(73) Assignee: Sony Corporation (JP)

(*) Notice: Subject to any disclaimer, the term of this patent is extended or adjusted under 35 U.S.C. 154(b) by 0 days.

(21) Appl. No.: 09/626,888

(22) Filed: Jul. 27, 2000

(30) Foreign Application Priority Data

Aug. 6, 1999 (JP) ............................. 11-224520

(51) Int. Cl.$^7$ ..................... H01L 21/20; H01L 21/36; H01L 21/00; H01L 21/84
(52) U.S. Cl. ........................ 438/486; 438/166
(58) Field of Search ................ 438/479, 165, 438/486, 489, 478, 149

(56) References Cited

U.S. PATENT DOCUMENTS

| | | |
|---|---|---|
| 5,145,808 A | 9/1992 | Sameshima |
| 5,365,875 A | 11/1994 | Asai |
| 5,815,494 A | 9/1998 | Yamazaki |
| 5,858,822 A | 1/1999 | Yamazaki |
| 6,194,023 B1 * | 2/2001 | Mitsuhashi et al. ............ 427/8 |
| 6,270,492 B1 * | 8/2001 | Sinofsky ................... 606/15 |
| 6,274,414 B1 * | 8/2001 | Ogata et al. ................ 438/166 |
| 6,274,888 B1 * | 8/2001 | Suzuki et al. ................ 257/72 |

FOREIGN PATENT DOCUMENTS

FR 2 780 736 2/2000

* cited by examiner

Primary Examiner—Richard Elms
Assistant Examiner—Adam Pyonin
(74) Attorney, Agent, or Firm—Rader, Fishman & Grauer PLLC; Ronald P. Kananen, Esq.

(57) ABSTRACT

In crystallizing a semiconductor thin film of large area by overlapping regions of irradiation with a laser beam, uniform crystallinity of the film is achieved. A semiconductor thin film is crystallized by performing shaping laser light emitted to define a laser beam which has a predetermined intensity distribution in a predetermined irradiation region, and repeatedly irradiating the semiconductor thin film with the laser beam while scanning the film so that irradiation regions may be overlapped. The laser beam is shaped so that the sectional intensity distribution of the laser beam in the irradiation region as taken in the direction of the scanning may be convex, and that the peak of the intensity distribution lies at a position which is between the front end and rear end of the irradiation region in relation to the scanning direction and which is nearer to the front end with respect to the middle of the irradiation region. The laser beam is so shaped that an intensity at the front end of the irradiation region becomes lower in a range within 30% as compared with the intensity of the peak, and the intensity at the rear end of the irradiation region becomes lower in a range exceeding 5% as compared with the intensity of the peak.

13 Claims, 11 Drawing Sheets

METHOD OF CRYSTALLIZING A SEMICONDUCTOR THIN FILM, AND METHOD OF MANUFACTURING A THIN-FILM SEMICONDUCTOR DEVICE

BACKGROUND OF THE INVENTION

1. Field of the Invention

The present invention relates to a method of crystallizing a semiconductor thin film, and a laser irradiation apparatus which is used for the method. Also, it relates to a thin film transistor and a display device, for example, LCD or organic EL display as are fabricated by utilizing the method and the apparatus.

2. Description of the Related Art

Crystallizing annealing which employs laser light has been developed as a part of an expedient by which a process for manufacturing a thin film transistor is turned into a low temperature process. This consists in that a non-monocrystalline semiconductor thin film of amorphous silicon, polycrystal silicon of comparatively small grain diameters, or the like formed on an insulating substrate, is irradiated with laser light to be locally heated, whereupon the semiconductor thin film is converted (crystallized) into a polycrystal of comparatively large grain diameters in the cooling process thereof. The thin film transistor is integrally formed using the crystallized semiconductor thin film as an active layer (channel region). Owing to the adoption of such crystallizing annealing, it is permitted to establish a low temperature process for a thin-film semiconductor device, and to use an inexpensive glass substrate, unlike an expensive quartz substrate of excellent heat resistance.

In the crystallizing annealing, it is common practice that the pulses of laser light in the shape of a line are intermittently projected while being overlapped in a scanning direction. The semiconductor thin film can be crystallized comparatively uniformly by projecting the laser light overlappingly. The crystallizing annealing which employs the laser light in the linear shape (line beam) is schematically illustrated in FIG. 11. The laser light 50 shaped into the line extending in the Y-direction of an insulating substrate 1 made of glass or the like is projected from the front surface side of the insulating substrate 1 formed with a semiconductor thin film beforehand. On this occasion, the insulating substrate 1 is moved in an X-direction (scanning direction) relatively to the irradiation region thereof. Here, the irradiation is done while the line beam 50 emitted from the light source of an excimer laser is being intermittently moved in overlapping fashion. More specifically, the insulating substrate 1 is scanned through a stage member in the X-direction relatively to the line beam 50. The stage member is moved at a pitch smaller than the widthwise dimension of the line beam 50 by one shot, so that the whole substrate 1 can be irradiated with the line beam 50, thereby to carry out the crystallizing annealing.

Laser light is sequentially outputted as pulses from a laser light source. The intensities (energy densities per unit area) of the individual pulses are not always constant, but they fluctuate in excess of ±15 [%] even with an up-to-date laser light source. Therefore, in a case where the laser light has been projected by overlapping the pulses repeatedly, local dispersion comes out in the diameters of the crystal grains of a crystallized semiconductor thin film in accordance with dispersion in the intensities of the individual pulses. This appears as dispersion in the characteristics of thin film transistors which are integrally formed on an insulating substrate. In a case where a display device, such as liquid crystal panel, has been fabricated using such an insulating substrate, the characteristics dispersion appears as non-uniformity in an image quality or as pixel defects.

FIG. 12 is a schematic plan view illustrating an example of a region of irradiation with a line beam. The irradiation region is in, for example, an elongate shape having longer latera of 200 [mm] and shorter latera of 400 [μm], and it scans in the direction of the shorter latera. Irradiation regions adjacent to each other overlap at their parts of, for example, 95 [%]. Accordingly, the line beam having the shown irradiation region is moved stepwise at intervals of 20 [μm]. When note is taken of one point on a substrate, the line beam passes 20 times at the steps of 20 [μm], and the point is irradiated with laser light 20 times in total.

FIG. 13 is a graph schematically showing the sectional intensity distribution of the line beam along line X—X indicated in FIG. 12. In general, the sectional intensity distribution of a line beam in the shorter axial direction thereof is in the shape of a rectangle. When the line beam scans at the steps of 20 [μm], a certain point on an insulating substrate is intermittently irradiated with laser light 20 times. Thus, a semiconductor thin film corresponding to the point repeats melting based on the laser irradiation and solidification based on cooling, 20 times, and crystal grains enlarge meantime. In actuality, however, dispersion is involved in the intensities of individual laser beams as stated before. Accordingly, when one point is noted, it is not irradiated with energy being always at the same level, repeatedly 20 times, but it is struck by energy having a dispersion of about ±15 [%]. In general, the crystal grains enlarges more as the laser light intensity is higher, but they turn into microcrystals contrariwise when a critical intensity is exceeded. Accordingly, when an abrupt upward fluctuation in the energy exists during the repeated pulse irradiation, the crystal grains might turn into the microcrystals on the contrary. Especially in the case of noting one place, when the abrupt upward fluctuation of the energy occurs at the final step among the 20 times of repeated irradiating steps, the crystal state of the place ends in a microcrystalline one left intact. Conversely, when the line beam of high energy is abruptly projected at the initial step among the 20 times of repeated irradiating steps, hydrogen might ablate on the occasion of the melting of the semiconductor thin film of amorphous silicon which has contained the hydrogen in large amounts at the stage of forming the film. When the ablation occurs, the semiconductor thin film itself changes in quality, and no normal crystal grains can be obtained even by thereafter irradiating the thin film with the line beam repeatedly.

SUMMARY OF THE INVENTION

In order to solve the problems of the prior art as stated above, means to be explained below have been adopted. The present invention consists in a method of crystallizing a semiconductor thin film, having the shaping step of shaping laser light emitted from a laser light source, thereby to define a laser beam which has a predetermined intensity distribution in a predetermined irradiation region; and the irradiating step of repeatedly irradiating the semiconductor thin film formed over a substrate beforehand, with the laser beam while scanning the film so that irradiation regions may be overlapped; characterized in that said shaping step shapes said laser beam so that a sectional intensity distribution of said laser beam in the irradiation region as taken in a direction of the scanning may be convex, and that a peak of the intensity distribution may lie at a position which is between a front end and a rear end of said irradiation region in relation to the scanning direction and which is nearer to the front end with respect to the middle of said irradiation region. Preferably, said shaping step shapes said laser beam so that an intensity at said front end of said irradiation region may become lower in a range within 30 [%], as compared with an intensity of the peak. Also, said shaping step shapes said laser beam so that an intensity at the rear end of said irradiation region may become lower in a range exceeding 5 [%], as compared with the intensity of the peak. Besides, said shaping step shapes said laser beam so that the intensity of the peak may become lower in a range exceeding 10 [%], as compared with a critical intensity incapable of the crystallization. By way of example, said shaping step shapes said laser beam so that the sectional intensity distribution may become a triangle. Alternatively, said shaping step shapes said laser beam so that the sectional intensity distribution may become a parabola. In one aspect, said shaping step shapes said laser beam so that said irradiation region may become an elongate shape; and said irradiating step moves said irradiation region relatively to the substrate in a direction orthogonal to longer latera of the elongate shape so that longer latus parts of said elongate shape may be overlapped.

The present invention further comprehends a method of manufacturing a thin-film semiconductor device as utilizes the above method of crystallizing a semiconductor thin film. More specifically, the present invention consists in a method of manufacturing a thin-film semiconductor device, having the film forming step of forming a semiconductor thin film over a substrate; the shaping step of shaping laser light emitted from a laser light source, thereby to define a laser beam which has a predetermined intensity distribution in a predetermined irradiation region; the irradiating step of repeatedly irradiating the semiconductor thin film formed over the substrate, with the laser beam while scanning the film so that irradiation regions may be overlapped, thereby to crystallize said semiconductor thin film; and the working step of forming a thin film transistor by utilizing the crystallized semiconductor thin film for element regions; characterized in that said shaping step shapes said laser beam so that a sectional intensity distribution of said laser beam in the irradiation region as taken in a direction of the scanning may be convex, and that a peak of the intensity distribution may lie at a position which is between a front end and a rear end of said irradiation region in relation to the scanning direction and which is nearer to the front end with respect to the middle of said irradiation region.

Besides, the present invention comprehends a laser irradiation apparatus which is applied to the above method of crystallizing a semiconductor thin film. More specifically, the present invention consists in a laser irradiation apparatus which, in order to irradiate a semiconductor thin film formed over a substrate beforehand, with a laser beam, thereby to crystallize the semiconductor thin film, is furnished with a laser light source for emitting laser light; shaping means for shaping the laser light, thereby to define a laser beam having a predetermined intensity distribution in a predetermined irradiation region; and irradiation means for repeatedly irradiating the semiconductor thin film formed over the substrate beforehand, with the laser beam while scanning the film so that irradiation regions may be overlapped; characterized in that said shaping means shapes said laser beam so that a sectional intensity distribution of said laser beam in the irradiation region as taken in a direction of the scanning may be convex, and that a peak of the intensity distribution may lie at a position which is between a front end and a rear end of said irradiation region in relation to the scanning direction and which is nearer to the front end with respect to the middle of said irradiation region.

In addition, the present invention comprehends a thin film transistor which is fabricated by utilizing the method of crystallizing a semiconductor thin film and the laser irradiation apparatus as stated above. More specifically, the present invention consists in a thin film transistor having a multi-layer construction which includes a semiconductor thin film, a gate insulating film stacked on one surface of the semiconductor thin film, and a gate electrode stacked on the semiconductor thin film through the gate insulating film, characterized in that said semiconductor thin film has been crystallized by shaping laser light emitted from a laser light source, thereby to define a laser beam which has a predetermined intensity distribution in a predetermined irradiation region, and repeatedly irradiating said semiconductor thin film with the shaped laser beam while scanning said film so that irradiation regions may be overlapped; and that said semiconductor thin film has been crystallized by the irradiation thereof with said laser beam especially shaped so that a sectional intensity distribution of said laser beam in the irradiation region as taken in a direction of the scanning may be convex, and that a peak of the intensity distribution may lie at a position which is between a front end and a rear end of said irradiation region in relation to the scanning direction and which is nearer to the front end with respect to the middle of said irradiation region.

Further, the present invention comprehends a display device of active matrix type as includes the above thin film transistors. More specifically, the present invention consists in a display device having a pair of substrates joined to each other through a predetermined gap, and an electrooptic substance which is held in the gap, wherein one of the substrates is formed with a counter electrode, while the other substrate is formed with a pixel electrode, and a thin film transistor for driving the pixel electrode, and wherein the thin film transistor is formed of a semiconductor thin film, and a gate electrode which is stacked on one surface of the semiconductor thin film through a gate insulating film, characterized in that said semiconductor thin film has been crystallized by shaping laser light emitted from a laser light source, thereby to define a laser beam which has a predetermined intensity distribution in a predetermined irradiation region, and repeatedly irradiating said semiconductor thin film with the shaped laser beam while scanning said film so that irradiation regions may be overlapped; and that said semiconductor thin film has been crystallized by the irradiation thereof with said laser beam especially shaped so that a sectional intensity distribution of said laser beam in the irradiation region as taken in a direction of the scanning may be convex, and that a peak of the intensity distribution may lie at a position which is between a front end and a rear end of said irradiation region in relation to the scanning direction and which is nearer to the front end with respect to the middle of said irradiation region.

According to the present invention, the laser beam is shaped so that the sectional intensity distribution of the laser beam in the irradiation region as taken in the scanning direction may be convex. Especially, the laser beam is shaped so that the peak of the convex sectional intensity distribution may lie at the position which is between the front end and rear end of the irradiation region in relation to the scanning direction and which is nearer to the front end with respect to the middle of the irradiation region. Accordingly, even in a case where the intensity of the laser beam has abruptly fluctuated upwards just at the position of the peak, and where the critical intensity has been exceeded to microcrystallize the semiconductor thin film once, the thin film has room for being thereafter repeatedly irradiated with the laser beam, and hence, the crystal state of the thin film is restorable. More specifically, owing to the peak brought nearer to the front end with respect to the middle, even when the thin film has been once microcrystallized due to the abrupt dispersion, it is restored into a polycrystal state again by the succeeding irradiation. Incidentally, the intensity at the front end part is suppressed low, so that even when the abrupt upward fluctuation of the intensity has occurred here, the temperature of the front end part does not rise extraordinarily, ablation being preventable. Besides, the energy intensity on the rear end side is suppressed somewhat lower as compared with the peak. Accordingly, even when the abrupt upward fluctuation of the energy has occurred here, it is not apprehended that the critical intensity will be easily exceeded, and that the microcrystallization of the thin film not being restorable will arise. In addition, even if the microcrystallization has arisen at the part of the peak, it can be restored by the succeeding laser beam irradiation at the somewhat lower intensity on the rear end side.

BRIEF DESCRIPTION OF THE DRAWINGS

FIG. 1A is a schematic block diagram showing a laser irradiation apparatus and a semiconductor-thin-film crystallizing method according to the present invention, while

DESCRIPTION OF THE PREFERRED EMBODIMENTS

Figure 1A:
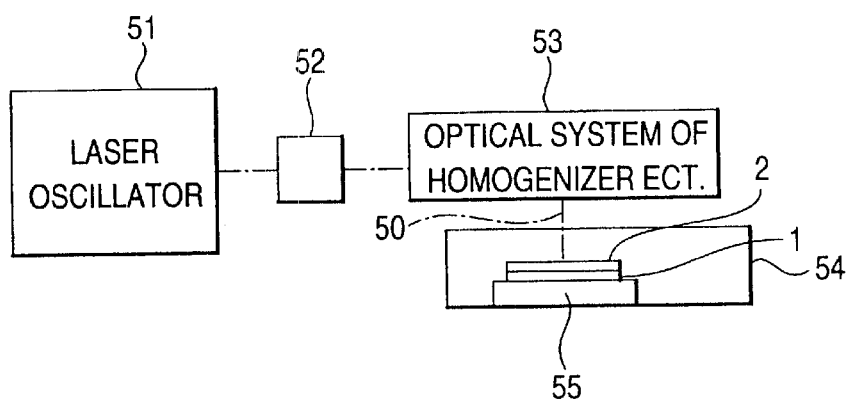

Now, embodiments of the present invention will be described in detail with reference to the drawings. FIG. 1A is a schematic block diagram exemplifying a laser irradiation apparatus and a semiconductor-thin-film crystallizing method according to the present invention. As shown in the figure, the laser irradiation apparatus is such that laser light 50 oscillated by a laser oscillator (laser light source) 51 is regulated to a suitable energy intensity by the use of an attenuator 52. Further, the laser light 50 is shaped into, for example, an elongate shape by an optical system 53 which includes a homogenizer etc. Besides, an insulating substrate 1 comprising, for example a glass substrate, which is put on an X-Y stage 55 inside a chamber 54 is irradiated with the laser light 50. Incidentally, a semiconductor thin film 2 which is an object to-be-processed is formed on the insulating substrate 1 beforehand. The interior of the chamber 54 is held in a nitrogen atmosphere, the atmospheric air (i. e., open air atmosphere), any other gaseous atmosphere, or a vacuum atmosphere created by a dry pump or the like. In some cases, crystallizing annealing may well be carried out in the atmospheric air by only the X-Y stage 55 without employing the chamber 54. When the semiconductor thin film 2 made of, for example, amorphous silicon is formed on the insulating substrate 1 by a suitable method beforehand, the amorphous silicon is converted into polycrystal silicon by the irradiation with the laser light 50. As apparent from the above description, the attenuator 52 and the optical system 53 of the homogenizer etc. constitute shaping means, which shapes the laser light 50 so as to define the laser beam 50 having a predetermined intensity distribution in a predetermined irradiation region. Besides, the X-Y stage 55 forms part of irradiation means, which projects the laser beam 50 onto the semiconductor thin film 2 formed on the substrate 1 beforehand, repeatedly while scanning the film 2 so that irradiation regions may be overlapped. An XeCl or KrF excimer laser of short wavelength is used as the laser light source 51 here, but it is a matter of course that the present invention is not restricted to the excimer laser.

Figure 1B:
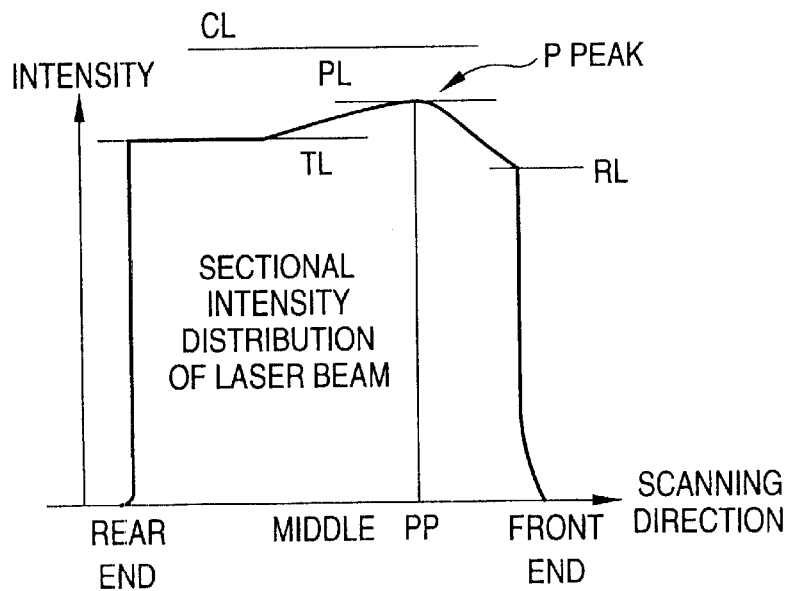
FIG. 1B is a diagram showing the sectional intensity distribution of a laser beam shaped according to the present invention.

FIG. 1B schematically illustrates the sectional intensity distribution of the laser beam shaped by the shaping means stated above. Here, the laser beam is so shaped that the sectional intensity distribution of the laser beam in the irradiation region as taken in a scanning direction is convex, and that the peak P of the intensity distribution lies at a position which is between the front end and rear end of the irradiation region in relation to the scanning direction and which is nearer to the front end with respect to the middle of the irradiation region. Such shaping can be incarnated by adjusting the homogenizer and a cutting filter. As stated before, the peak P is set at the position PP nearer to the front end with respect to the middle, whereby even if microcrystallization takes place at a preceding stage in the repeated irradiation, it can be restored at a later stage. Preferably, the laser beam is so shaped that the intensity level PL of the peak P becomes lower in a range exceeding 10 [%], as compared with a critical intensity CL at which crystallization is impossible. As stated before, the intensity of the laser beam fluctuates within the range of ±15 [%]. Accordingly, when the peak level PL is made lower than the critical intensity CL by, at least, 15 [%], the microcrystallization etc. ascribable to any abrupt fluctuation do not occur. Under this condition, however, the entire laser beam intensity is too low to attain the effective utilization of the energy of the laser beam. In this embodiment, therefore, the peak level PL has a margin of about 10 [%] afforded thereto relatively to the critical intensity CL. It is accordingly apprehended that the peak level PL will sometimes exceed the level CL to incur the microcrystallization. In such a case, however, the laser beam is repeatedly projected at the level TL of the rear end side as is set somewhat lower, and hence, microcrystals can be restored to a polycrystal. Also, in this embodiment, the laser beam is so shaped that an intensity RL at the front end of the irradiation region becomes lower in a range within 30 [%], as compared with the intensity level PL of the peak P. Thus, even when the abrupt upward fluctuation of the energy occurs at the front end, ablation can be prevented. Incidentally, when the intensity level RL of the front end is made lower than the peak level PL in a range exceeding 30 [%], the laser beam intensity is too low and becomes ineffective for the crystallization. Further, the laser beam is so shaped that the intensity TL at the rear end of the irradiation region becomes lower in a range exceeding 5 [%], as compared with the peak intensity PL. Accordingly, the intensity level TL at the rear end becomes lower by about 15 [%] as compared with the critical intensity level CL. Even when the abrupt upward fluctuation has occurred, it does not exceed 15 [%], so that the level TL of the rear end side does not exceed the critical intensity CL. Accordingly, the microcrystallization is not apprehended to arise on the rear end side. Incidentally, it brings forth another effect that the intensity level TL of the rear end side is set somewhat lower as compared with the peak level PL. Generally speaking, in laser annealing, the optimum energy density differs depending upon the thickness of a semiconductor thin film before being crystallized. Usually, an energy density is determined in conformity with the maximum of dispersion in the film thickness. With this contrivance, a thinner film part is liable to microcrystallization due to energy which is too intense and which exceeds a critical intensity. In this regard, when the profile shown in FIG. 1B is used, the crystal state of the thinner film part is adjusted by the energy after the peak P as is set somewhat weaker. More specifically, the level TL of the rear end side in the profile is optimized for the thinner film part. On the other hand, the peak level PL in the profile is optimized for a thicker film part. Thus, uniform crystal grains are obtained as a whole without depending upon the dispersion of the film thickness. Incidentally, the profile shown in FIG. 1B is a mere example, and in general, any convex profile whose peak shifts nearer to its front end is satisfactory. By way of example, the convex profile may well be a triangular profile or a parabolic profile. The triangular profile is in the shape that the vertex of the profile lies at a position which is nearer to the front end thereof with respect to the middle thereof, and that an inclination from the vertex toward the front end is steep, whereas an inclination from the vertex toward the rear end of the profile is comparatively gentle.

Figure 2:
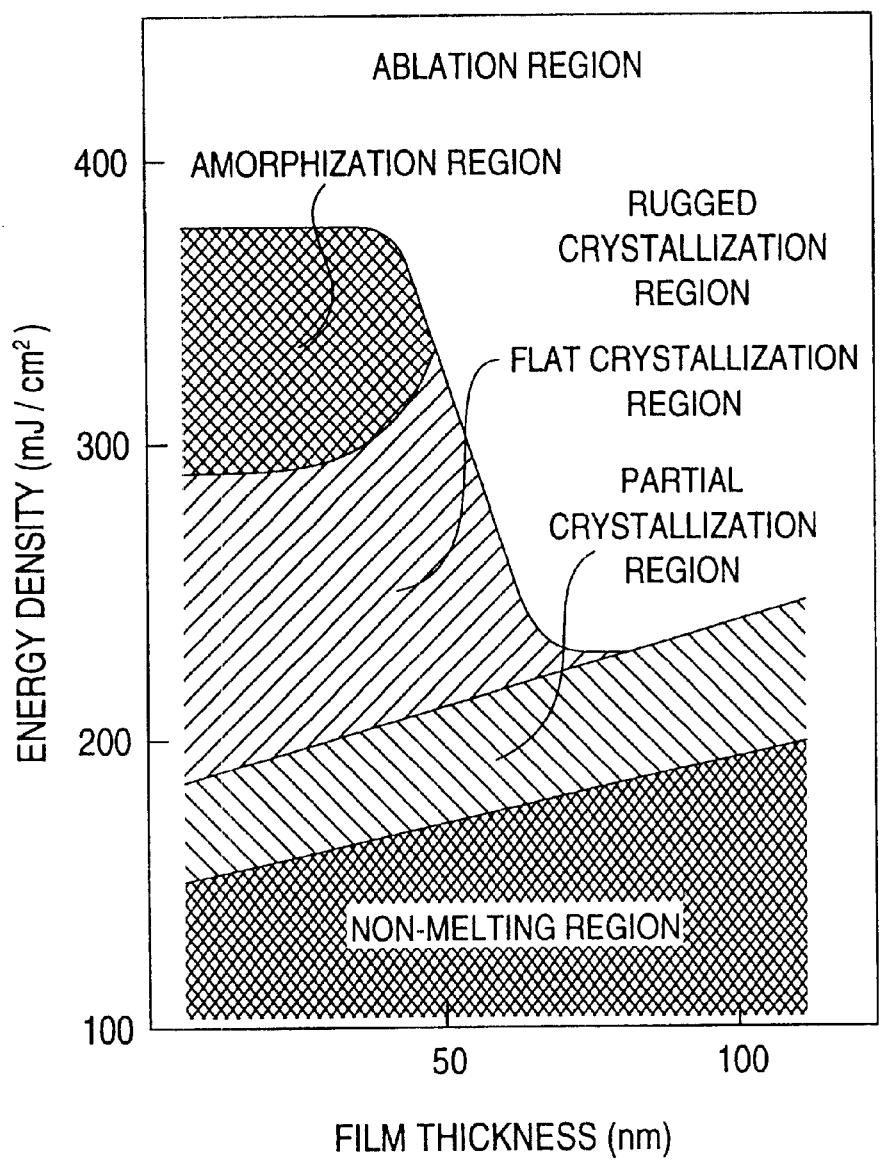
FIG. 2 is a graph showing the relationship between the thickness of a semiconductor thin film and the energy density of the laser beam.

FIG. 2 is a graph showing the relationship between the thickness of a semiconductor thin film and the energy density (intensity) of a laser beam. As apparent from the graph, when the film thickness exceeds 50 [nm], it is difficult to obtain a good crystal state by laser annealing. With note taken of the semiconductor thin film having a thickness of 50 [nm], when the energy density is below 150 [mJ/cm$^2$], the intensity of the laser beam is too low, and the semiconductor thin film is not molten originally. That is, the energy density below 150 [mJ/cm$^2$] corresponds to a non-melting region. When the energy density is below 200 [mJ/cm$^2$], the semiconductor thin film is crystallized only partially, and the laser beam intensity is low yet. A range in which the energy density is 200 [mJ/cm$^2$] through 300 [mJ/cm$^2$] inclusive corresponds to a flat crystallization region, in which a favorable polycrystal is obtained. When the film thickness exceeds 50 [nm], the semiconductor thin film turns into a rugged crystallization region even in the above energy density range, and ruggedness appears on the surface of the semiconductor thin film. When the energy density exceeds 300 [mJ/cm$^2$], the laser beam intensity is too high on the contrary, and microcrystallization occurs to bring the semiconductor thin film into an amorphization region. That is, the energy density of 300 [mJ/cm$^2$] is the critical intensity. However, the values of the energy density are merely exemplary, and actually they change greatly in accordance with the pulse width of the laser beam, and so on. The example of FIG. 2 corresponds to a case where the pulse width of the laser beam is 20 [ns].

Figure 3:
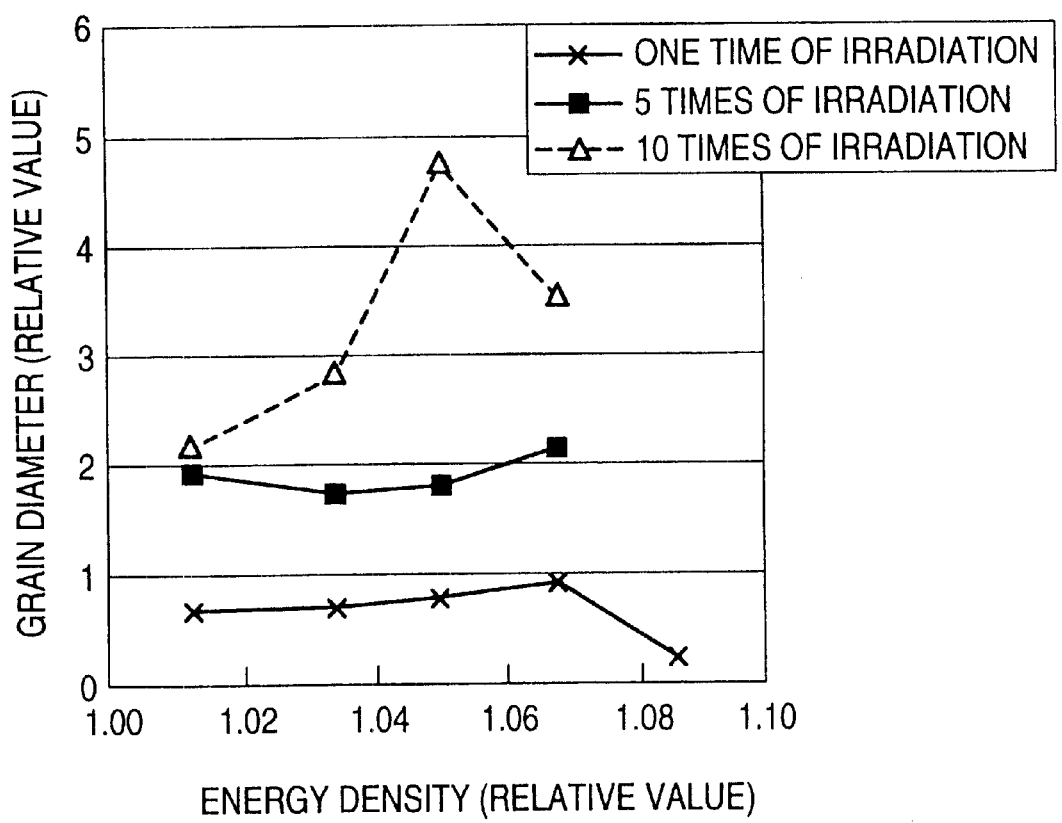
FIG. 3 is a graph showing the relationship between the energy density of the laser beam and the grain diameter of a crystal.

FIG. 3 is a graph showing the relationship between the energy density of a laser beam and the grain diameter of a crystal. The energy density is taken in terms of relative values on the axis of abscissas, while the crystal grain diameter is taken in terms of relative values on the axis of ordinates. Incidentally, the number of times of repeated irradiation is taken as a parameter, and the cases of one time of irradiation, 5 times of irradiation and 10 times of irradiation are taken as examples and are graphed here. As shown in the figure, with increase in the number of times of irradiation, the crystal grain diameter becomes larger, and a better crystal state is obtained. That is, the repeated irradiation scheme is effective for obtaining the good crystal state. However, as apparent by noting the graphic illustration of the 10 times of irradiation, the crystal grain diameter attained is small contrariwise when the energy density is too high. From this result, it is understood that the energy density of the laser beam needs to be optimized.

Figure 4:
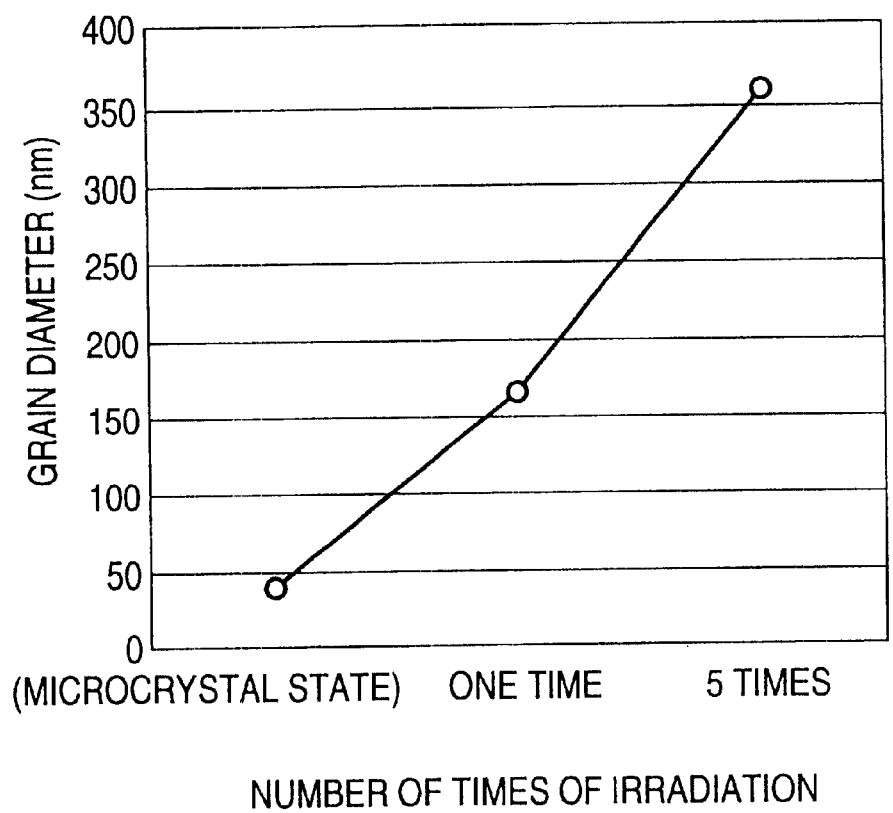
FIG. 4 is a graph showing the relationship between the number of times of irradiation and the grain diameter of the crystal.

FIG. 4 is a graph showing the relationship between the number of times of irradiation and the grain diameter of a crystal. The graph illustrates that the irradiation with the laser beam is repeated for a semiconductor thin film being in a microcrystal state, whereby the crystal state of the thin film is restored. By way of example, the crystal grain diameter is smaller than 50 [nm] in the initial microcrystal state. When the thin film in this state is irradiated once, the crystal grain diameter is restored to about 150 [nm]. Further, when the irradiation is repeated 5 times, the crystal grain diameter is restored to 350 [nm]. In this manner, even when the thin film has once fallen into the microcrystal state due to the irradiation with the laser beam which is at the energy density exceeding the critical intensity, the crystal state can be restored by thereafter repeatedly irradiating the thin film with the laser beam which is below the critical intensity.

Figure 5:
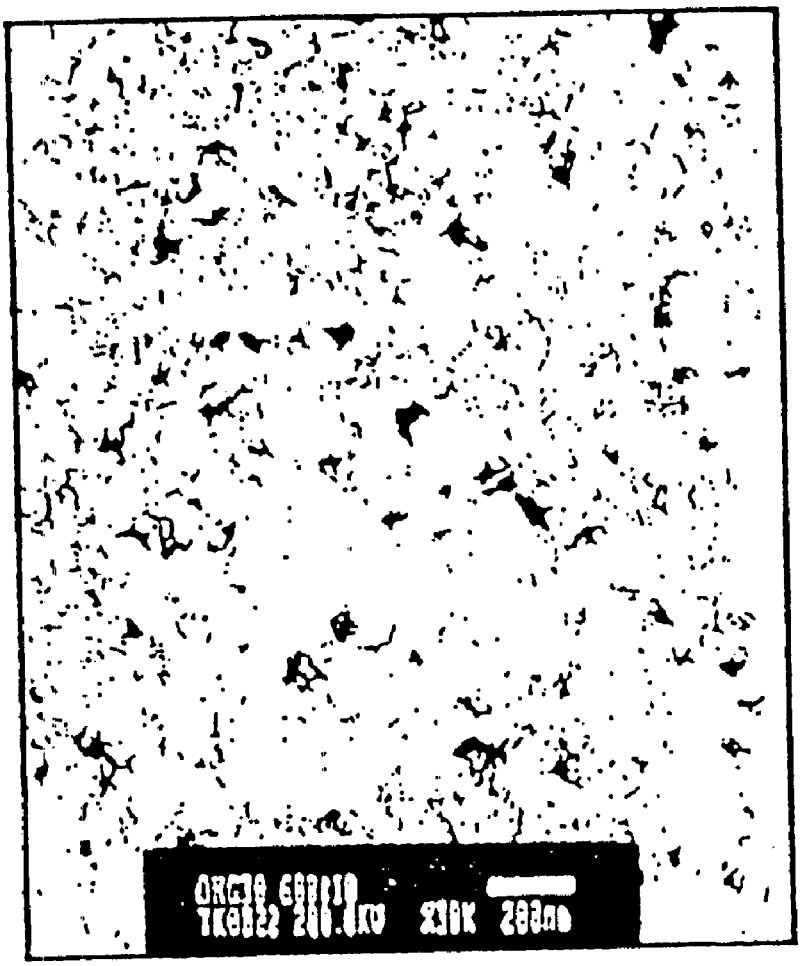
FIG. 5 is a microphotographic diagram showing the crystallized state of a semiconductor thin film.
Figure 6:
FIG. 6 is a microphotographic diagram showing the crystallized state of the semiconductor thin film.
Figure 7:
FIG. 7 is a microphotographic diagram showing the crystallized state of the semiconductor thin film.

FIG. 5 is a microphotograph illustrating the surface of a silicon semiconductor thin film which has been microcrystallized by the irradiation with the laser beam exceeding the critical intensity. FIG. 6 is a microphotograph illustrating a state where the semiconductor thin film of the microcrystallized state as shown in FIG. 5 has been recrystallized by irradiating it with the laser beam once. Further, FIG. 7 is a microphotograph showing a state where the thin film has been recrystallized by repeating the laser beam irradiation 5 times. As apparent by comparing FIG. 5 through FIG. 7, the microcrystallized semiconductor thin film can be returned into the polycrystal state by the repeated irradiation.

Figure 8A:
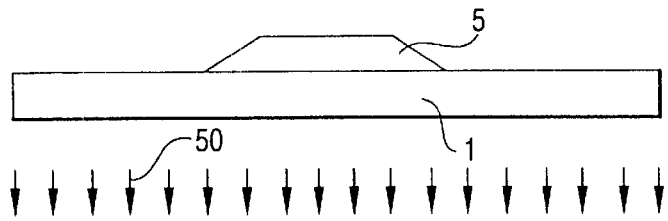
FIGS. 8A through 8D are sectional views showing the manufactural flow chart of a thin film transistor according to the present invention.

FIGS. 8A through 8D are sectional views showing the flow of an example of a method of manufacturing a thin film transistor according to the present invention. Here, the thin film transistor is of bottom gate structure. First, as shown in FIG. 8A, a metal Al, Ta, Mo, W, Cr or Cu, or any alloy of such metals is deposited on an insulating substrate 1 made of glass or the like, at a thickness of 100 through 200 [nm], and the deposited material is worked into a gate electrode 5 by patterning.

Figure 8B:
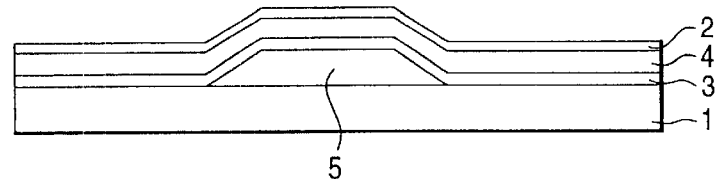

Subsequently, as shown in FIG. 8B, a gate insulating film is formed on the gate electrode 5. In this example, the gate insulating film employed a two-layer structure of a gate nitride film 3 (SiN$_x$) and a gate oxide film 4 (SiO$_2$). The gate nitride film 3 was formed in accordance with plasma CVD (PCVD) by employing a mixture of $SiH_4$ gas and $NH_3$ gas as a raw material gas. By the way, normal-pressure CVD or lowered-pressure CVD may well be adopted instead of the plasma CVD. Here in this example, the gate nitride film 3 was deposited at a thickness of 50 [nm]. The gate oxide film 4 was formed at a thickness of about 200 [nm] in succession to the formation of the gate nitride film 3. Further, a semiconductor thin film 2 made of amorphous silicon was successively formed at a thickness of about 40 [nm] on the gate oxide film 4. The gate insulating film of the two-layer structure and the amorphous semiconductor thin film 2 were successively formed without breaking the vacuum system of a film forming chamber. In the case of having employed the plasma CVD in the above film formation, a heat treatment is carried out at a temperature of 400 through 450 [° C.] in a nitrogen atmosphere for about one hour, thereby to emit hydrogen contained in the amorphous semiconductor thin film 2. Thus, so-called "dehydrogenation annealing" is performed. Subsequently, the amorphous semiconductor thin film 2 is crystallized by irradiating it with laser light 50. An excimer laser beam can be employed for the laser light 50. So-called "laser annealing" is powerful means for crystallizing a semiconductor thin film at a process temperature of or below 600 [° C.]. Here in this example, the crystallization is implemented in such a way that the amorphous semiconductor thin film 2 is irradiated with the laser beam 50 excited in the shape of pulses. Concretely, there are performed the shaping step of shaping the laser light 50 emitted from a laser light source, thereby to define a laser beam which has a predetermined intensity distribution in a predetermined irradiation region, and the irradiating step of repeatedly irradiating the semiconductor thin film 2 formed over the substrate 1 beforehand, with the laser beam 50 while scanning the film 2 so that irradiation regions may be overlapped. Here, the shaping step shapes the laser beam 50 so that the sectional intensity distribution of the laser beam 50 in the irradiation region as taken in the direction of the scanning may be convex, and that the peak of the intensity distribution may lie at a position which is between the front end and rear end of the irradiation region in relation to the scanning direction and which is nearer to the front end with respect to the middle of the irradiation region. Of course, the irradiation region itself with the laser beam may be a so-called "linear shape (elongate shape)" or a so-called "planar shape".

Figure 8C:
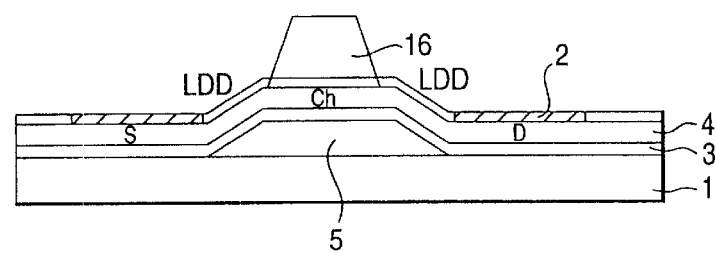

As shown in FIG. 8C, by way of example, $SiO_2$ is formed on the polycrystal semiconductor thin film 2 crystallized by the preceding step, at a thickness of about 100 [nm] through 300 [nm] by plasma CVD. The $SiO_2$ is patterned into a predetermined shape so as to be worked into a stopper film 16. In this case, the stopper film 16 is patterned so as to register with the gate electrode 5 by employing a back exposure technique. That part of the polycrystal semiconductor thin film 2 which lies underneath the stopper film 16 is protected as a channel region Ch. Subsequently, using the stopper film 16 as a mask, the semiconductor thin film 2 is doped with an impurity (for example, $P^+$ ions) by ion doping, thereby to form LDD regions. A dose on this occasion is, for example, $6 \times 10^{12}$ through $5 \times 10^{13}$ [/cm$^2$]. Further, a photoresist is patterned and deposited so as to cover the stopper film 16 and the LDD regions on both the sides thereof, whereupon using the photoresist as a mask, the polycrystal semiconductor thin film 2 is doped with an impurity (for example, $P^+$ ions) at a high concentration, thereby to form a source region S and a drain region D. Ion doping, for example, can be employed for the impurity doping. This technique introduces the impurity by electric field acceleration without applying mass separation. Here in this example, the source region S and drain region D were formed by introducing the impurity at a dose of about $1 \times 10^{15}$ [/cm$^2$]. By the way, in case of forming a thin film transistor of P-channel, not shown, the regions of the N-channel thin film transistor may be covered with a photoresist, whereupon $B^+$ ions being an impurity changed-over from the $P^+$ ions may be subjected to ion doping at a dose of about $1 \times 10^{15}$ [/cm$^2$].

Thereafter, the impurity with which the polycrystal semiconductor thin film 2 has been doped is activated. By way of example, laser activation annealing which employs an excimer laser light source is carried out. More specifically, the glass substrate 1 is irradiated with the pulses of the excimer laser while being scanned, thereby to activate the impurity with which the polycrystal semiconductor thin film 2 has been doped.

Figure 8D:
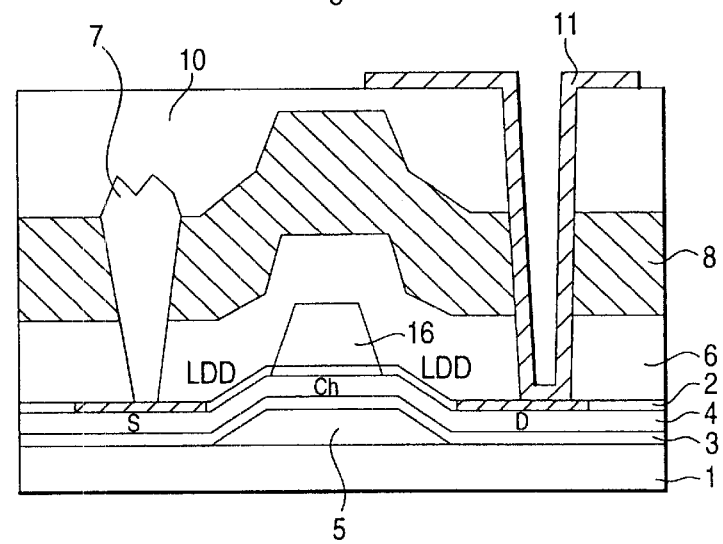

Lastly, as shown in FIG. 8D, $SiO_2$ is formed into a film at a thickness of about 200 [nm], and the film is used as an inter-layer insulating film 6. After the formation of the inter-layer insulating film 6, $SiN_x$ is formed into a film at a thickness of about 200 through 400 [nm] by plasma CVD, and the film is used as a passivation film (cap film) 8. At this stage, a heat treatment at about 350 [° C.] is performed in an atmosphere of nitrogen gas or a forming gas or vacuum for one hour, whereby hydrogen atoms contained in the inter-layer insulating film 6 are diffused into the semiconductor thin film 2. Thereafter, a contact hole is provided, and Mo, Al or the like is sputtered at a thickness of 200 through 400 [nm], whereupon the sputtered metal is patterned into a predetermined shape and is worked into a wiring electrode 7. Further, the resulting structure is coated with a flattening layer 10 made of an acrylic resin or the like, at a thickness of about 1 [μm], followed by the provision of a contact hole. After a transparent electrically-conductive film made of ITO, IXO or the like has been sputtered on the flattening layer 10, it is patterned into a predetermined shape and is worked into a pixel electrode 11.

Figure 9A:
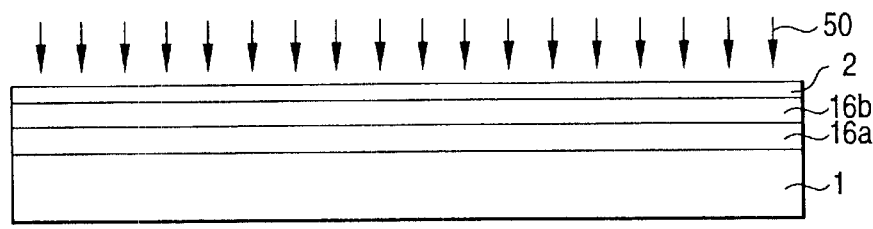
FIGS. 9A through 9C are sectional views showing the manufactural flow chart of another thin film transistor according to the present invention.

Another example of a thin film transistor according to the present invention will be described with reference to FIGS. 9A through 9C. First, as shown in FIG. 9A, subbing films 16a, 16b of two layers to serve as a buffer layer are successively formed on an insulating substrate 1 by plasma CVD. The subbing film 16a of the first layer is made of $SiN_x$, and its thickness is 100 through 200 [nm]. Besides, the subbing film 16b of the second layer is made of $SiO_2$, and its thickness is 100 through 200 [nm] similarly. A semiconductor thin film 2 made of polycrystal silicon is formed on the subbing film 16b made of $SiO_2$, at a thickness of, for example, 40 [nm] by lowered pressure chemical vapor deposition (LP-CVD). Subsequently, $Si^+$ ions are subjected to electric field acceleration by an ion implantation apparatus or the like so as to dope the semiconductor thin film 2 with the ions, thereby to amorphize the polycrystal silicon. Incidentally, a semiconductor thin film 2 made of amorphous silicon may well be deposited on the insulating substrate 1 by lowered-pressure chemical vapor deposition (LP-CVD), plasma CVD, sputtering or the like from the beginning, instead of the method in which the film of the polycrystal silicon is once formed and is then amorphized.

Thereafter, using the laser irradiation apparatus shown in FIG. 1, the semiconductor thin film 2 is crystallized by irradiating it with the laser beam 50. Concretely, there are performed the shaping step of shaping the laser light 50 emitted from a laser light source, thereby to define the laser beam which has a predetermined intensity distribution in a predetermined irradiation region, and the irradiating step of repeatedly irradiating the semiconductor thin film 2 formed over the substrate 1 beforehand, with the laser beam 50 while scanning the film 2 so that irradiation regions may be overlapped. Here, the shaping step shapes the laser beam 50 so that the sectional intensity distribution of the laser beam 50 in the irradiation region as taken in the direction of the scanning may be convex, and that the peak of the intensity distribution may lie at a position which is between the front end and rear end of the irradiation region in relation to the scanning direction and which is nearer to the front end with respect to the middle of the irradiation region.

Figure 9B:
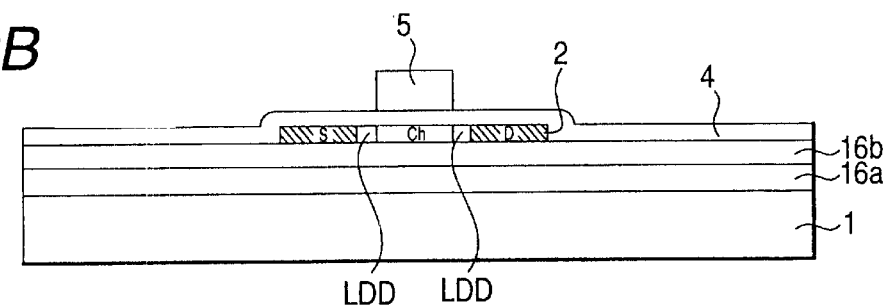

Subsequently, as shown in FIG. 9B, the semiconductor thin film 2 made of the polycrystal silicon, in which crystal grains have been enlarged, is patterned into the shape of an island. $SiO_2$ is grown on the resulting thin film at a thickness of 50 through 400 [nm] by plasma CVD, normal-pressure CVD, lowered-pressure CVD, ECR-CVD, sputtering or the like, and it is worked into a gate insulating film 4. Here, if necessary, ion implantation for Vth (a threshold voltage) is performed so as to dope the semiconductor thin film 2 with $B^+$ ions at a dose of, for example, $0.5 \times 10^{12}$ through $4 \times 10^{12}$ [/cm$^2$]. An acceleration voltage in this case is about 80 [keV]. Incidentally, the Vth ion implantation may well be done before the formation of the gate insulating film 4. Subsequently, a film of Al, Ti, Mo, W, Ta, doped polycrystal silicon or the like, or any alloy thereof is formed on the gate insulating film 4, at a thickness of 200 through 800 [nm], and the film is worked into a gate electrode 5 by patterning the film into a predetermined shape. Subsequently, the semiconductor thin film 2 is doped with $P^+$ ions by ion implantation employing mass separation, thereby to provide LDD regions. The ion implantation is performed for the whole surface of the insulating substrate 1 by utilizing the gate electrode 5 as a mask. A dose is $6 \times 10^{12}$ through $5 \times 10^{13}$ [/cm$^2$]. Incidentally, a channel region Ch which lies underneath the gate electrode 5 is protected, and the $B^+$ ions introduced by the Vth ion implantation beforehand are held therein as they are. After the ion implantation for the LDD regions, a resist pattern is formed so as to cover the gate electrode 5 and the surroundings thereof, and $P^+$ ions are implanted at a high concentration by ion shower doping of mass non-separation type, thereby to form a source region S and a drain region D. A dose in this case is, for example, about $1 \times 10^{15}$ [/cm$^2$]. Incidentally, an ion implantation apparatus of mass separation type may well be employed for the formation of the source region S and the drain region D. Thereafter, a process for activating the dopants introduced into the semiconductor thin film 2 is carried out. The activating process can be implemented by laser annealing.

Figure 9C:
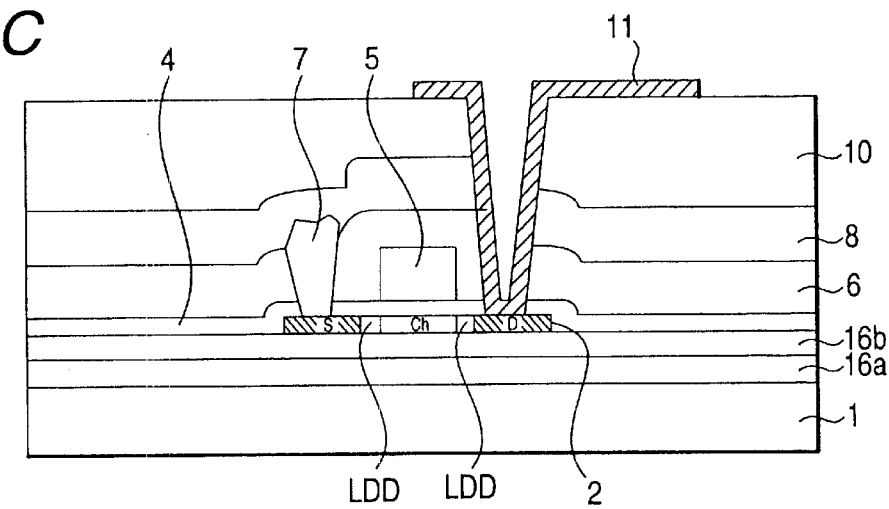

Lastly, as shown in FIG. 9C, an inter-layer insulating film 6 made of PSG or the like is formed so as to cover the gate electrode 5. After a contact hole is provided in the inter-layer insulating film 6, a film of Al—Si or the like is formed by sputtering, and it is patterned into a predetermined shape to be worked into a wiring electrode 7. $SiN_x$ is deposited at a thickness of about 200 through 400 [nm] by plasma CVD so as to cover the wiring electrode 7, and the deposited material is worked into a passivation film (cap film) 8. At this stage, annealing is performed at a temperature of 350 [° C.] is performed in nitrogen gas for about one hour, whereby hydrogen contained in the inter-layer insulating film 6 is diffused into the semiconductor thin film 2. The characteristics of the thin film transistor are improved by performing the so-called "hydrogenating process". The passivation film 8 is coated with a flattening layer 10 made of an acrylic resin or the like, at a thickness of about 1 [μm], and a contact hole is thereafter provided in the resulting structure. A transparent electrically-conductive film made of ITO, IXO or the like is sputtered on the flattening layer 10, and it is patterned into a predetermined shape so as to be worked into a pixel electrode 11.

Figure 10:
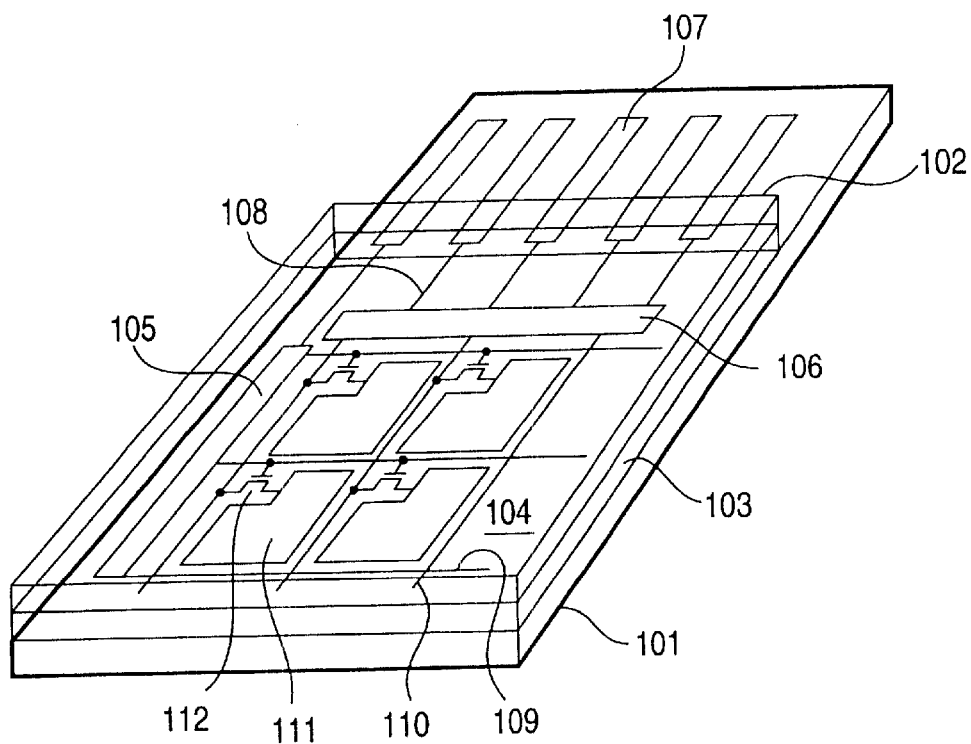
FIG. 10 is a schematic perspective view showing a display device according to the present invention.
Figure 11:
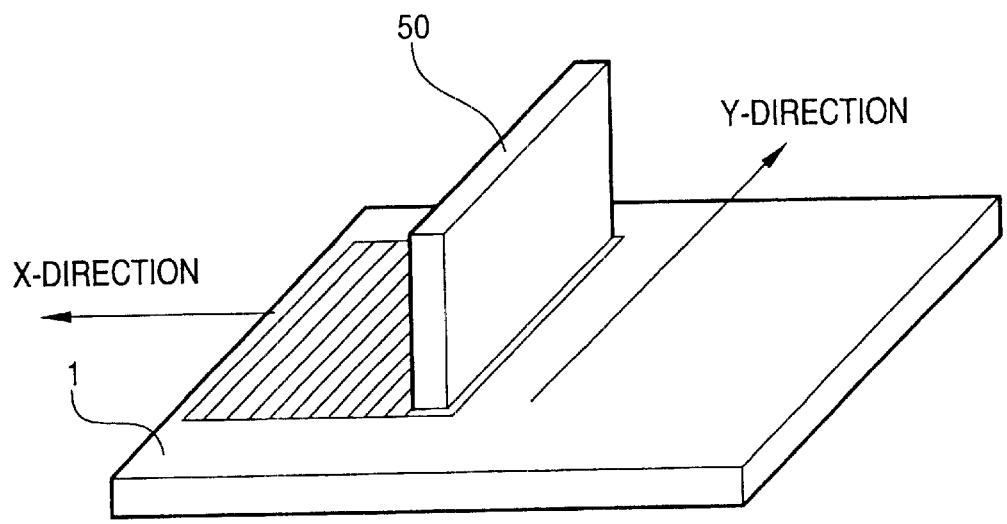
FIG. 11 is an explanatory view showing a prior-art method of crystallizing a semiconductor thin film.
Figure 12:
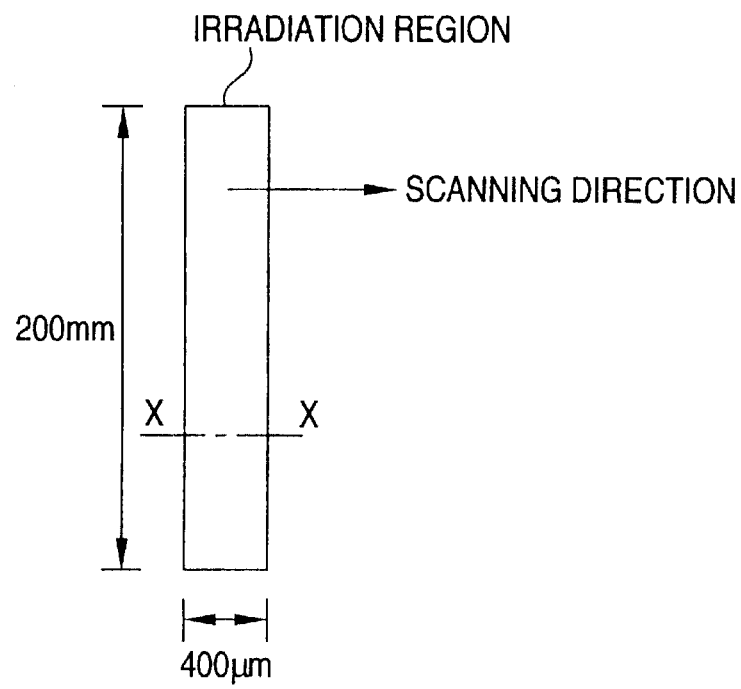
FIG. 12 is a diagram showing the sectional shape of an elongate laser beam.
Figure 13:
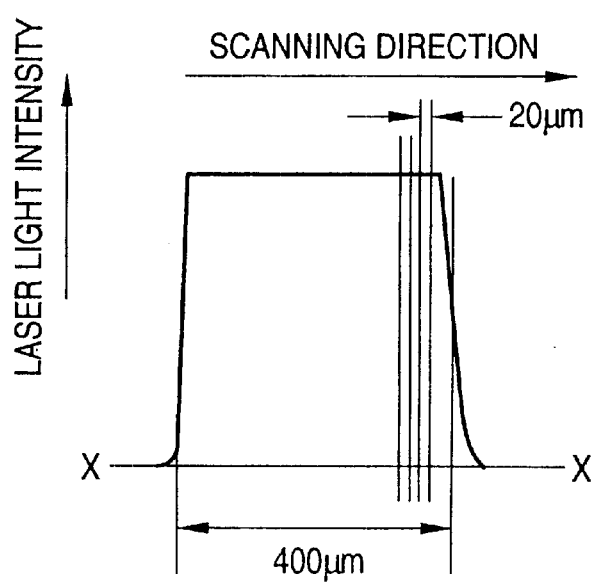
FIG. 13 is a diagram showing an energy distribution in the section of the elongate laser beam in the shorter axial direction thereof.

An example of an active matrix type display device which employs thin film transistors manufactured in accordance with the present invention will be finally described with reference to FIG. 10. As shown in the figure, the display device has a panel structure which includes a pair of insulating substrates 101, 102, and an electrooptic substance 103 held between both the substrates. A liquid crystal material, for example, is employed as the electrooptic substance 103. The lower insulating substrate 101 is integrally formed with a pixel array unit 104 and a drive circuit unit. The drive circuit unit is divided into a vertical scanner 105 and a horizontal scanner 106. Besides, terminal portions 107 for external connections are formed at the upper end of the peripheral part of the insulating substrate 101. The terminal portions 107 are connected to the vertical scanner 105 and the horizontal scanner 106 through wiring lines 108. Gate wiring lines 109 in rows and signal wiring lines 110 in columns are laid in the pixel array unit 104. A pixel electrode 111, and a thin film transistor 112 for driving it are formed at the intersection part of both the wiring lines. The gate electrode of the thin film transistor 112 is connected to the corresponding gate wiring line 109, the drain region thereof is connected to the corresponding pixel electrode 111, and the source region thereof is connected to the corresponding signal wiring line 110. The gate wiring lines 109 are connected to the vertical scanner 105, while the signal wiring lines 110 are connected to the horizontal scanner 106. The thin film transistor 112 for switching and driving the pixel electrode 111, and thin film transistors included in the vertical scanner 105 as well as the horizontal scanner 106, are fabricated in accordance with the present invention. of course, when an organic EL material is adopted as the electrooptic substance 103, the present invention is also applicable to an organic EL display device.

As described above, according to the present invention, the crystallization of a semiconductor thin film is performed after a laser beam is so shaped that the sectional intensity distribution of the laser beam in an irradiation region as taken in a scanning direction is convex, and that the peak of the intensity distribution lies at a position which is between the front end and rear end of the irradiation region in relation to the scanning direction and which is nearer to the front end with respect to the middle of the irradiation region. The laser beam intensity distribution is optimized in this manner, whereby a polycrystal semiconductor thin film of large area having uniform crystal grains can be obtained stably. Besides, even a laser light source whose dispersion in the intensity distribution of laser light is large is usable for a method of crystallizing the semiconductor thin film. In addition, even when the semiconductor thin film has dispersion in thickness, a uniform crystal state can be attained.

What is claimed is:

1. A method of crystallizing a semiconductor thin film, comprising the steps of:
   shaping laser light emitted from a laser light source, thereby defining a laser beam having a predetermined intensity distribution in a predetermined irradiation region; and
   repeatedly irradiating the semiconductor thin film formed over a substrate beforehand, with the laser beam while scanning the film so that irradiation regions overlap;
   wherein said laser beam is shaped so that a sectional intensity distribution of said laser beam in the predetermined irradiation region as taken in a direction of the scanning is convex, and that a peak of the intensity distribution lies at a position which is between a front end and a rear end of said irradiation region in relation to the scanning direction and which is nearer to the front end with respect to the middle of said irradiation region; and wherein said laser beam is shaped so that an intensity at said front end of said irradiation region is lower in a range within 30%, as compared with an intensity of the peak.

2. A method of crystallizing a semiconductor thin film as defined in claim 1, wherein said laser beam is shaped so that an intensity at the rear end of said irradiation region is lower in a range exceeding 5%, as compared with the intensity of the peak.

3. A method of crystallizing a semiconductor thin film as defined in claim 1, wherein said laser beam is shaped so that the intensity of the peak is lower in a range exceeding 10%, as compared with a critical intensity incapable of the crystallization.

4. A method of crystallizing a semiconductor thin film as defined in claim 1, wherein said laser beam is shaped so that the sectional intensity distribution is triangular.

5. A method of crystallizing a semiconductor thin film as defined in claim 1, wherein said laser beam is shaped so that the sectional intensity distribution becomes a parabola.

6. A method of crystallizing a semiconductor thin film as defined in claim 1, wherein:

said laser beam is shaped so that said irradiation region becomes an elongate shape; and repeated irradiation moves said irradiation region relatively to the substrate in a direction orthogonal to longer latera of the elongate shape so that longer latus parts of said elongate shape may be overlapped.

7. A method of manufacturing a thin-film semiconductor device, comprising the steps of:

forming a semiconductor thin film over a substrate;

shaping laser light emitted from a laser light source, thereby to define a laser beam having a predetermined intensity distribution in a predetermined irradiation region;

repeatedly irradiating the semiconductor thin film formed over the substrate, with the laser beam while scanning the film so that irradiation regions are overlapped, thereby to crystallize said semiconductor thin film; and forming a thin film transistor by utilizing the crystallized semiconductor thin film for element regions;

wherein said laser beam is shaped so that a sectional intensity distribution of said laser beam in the irradiation region as taken in a direction of the scanning is convex, and that a peak of the intensity distribution lies at a position which is between a front end and a rear end of said irradiation region in relation to the scanning direction and which is nearer to the front end with respect to the middle of said irradiation region.

8. A method of manufacturing a thin-film semiconductor device as defined in claim 7, wherein said laser beam is shaped so that an intensity at said front end of said irradiation region becomes lower in a range within 30%, as compared with the intensity of the peak.

9. A method of manufacturing a thin-film semiconductor device as defined in claim 7, wherein said laser beam is shaped so that an intensity at the rear end of said irradiation region becomes lower in a range exceeding 5%, as compared with the intensity of the peak.

10. A method of manufacturing a thin-film semiconductor device as defined in claim 7, wherein said laser beam is shaped so that the intensity of the peak becomes lower in a range exceeding 10%, as compared with a critical intensity incapable of the crystallization.

11. A method of manufacturing a thin-film semiconductor device as defined in claim 7, wherein said laser beam is shaped so that the sectional intensity distribution becomes triangular.

12. A method of manufacturing a thin-film semiconductor device as defined in claim 7, wherein said laser beam is shaped so that the sectional intensity distribution becomes a parabola.

13. A method of manufacturing a thin-film semiconductor device as defined in claim 7, wherein:

said laser beam is shaped so that said irradiation region becomes an elongate shape; and repeated irradiation moves said irradiation region relatively to the substrate in a direction orthogonal to longer latera of the elongate shape so that longer latus parts of said elongate shape are overlapped.

* * * * *